(12) United States Patent
Candelier et al.

(10) Patent No.: US 8,432,726 B2
(45) Date of Patent: Apr. 30, 2013

(54) SECURE NON-VOLATILE MEMORY

(75) Inventors: Philippe Candelier, Saint Mury Monteymond (FR); Laurent Dedieu, Le Champ-Pres-Froges (FR); Noureddine Larhriq, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 20 days.

(21) Appl. No.: 13/294,843

(22) Filed: Nov. 11, 2011

(65) Prior Publication Data

US 2012/0120716 A1    May 17, 2012

(30) Foreign Application Priority Data

Nov. 12, 2010    (FR) .................................... 10 04417

(51) Int. Cl.
*G11C 11/00*    (2006.01)
(52) U.S. Cl.
USPC .................... 365/154; 327/217; 365/189.011; 365/189.05
(58) Field of Classification Search .................. None
See application file for complete search history.

(56) References Cited

U.S. PATENT DOCUMENTS

| 7,009,905 B2 * | 3/2006 | Aipperspach et al. ........ 365/211 |
| 7,697,319 B2 | 4/2010 | Dedieu et al. ................ 365/154 |
| 2005/0063212 A1 | 3/2005 | Jacob et al. |
| 2012/0274353 A1 * | 11/2012 | Pedersen et al. ............... 326/40 |

FOREIGN PATENT DOCUMENTS

EP    1 818 942 B1    7/2011

OTHER PUBLICATIONS

M74HC4040 Datasheet "12 Stage Binary Counter," Jul. 2001, STMicroelectronics. pp. 1-11.*
M74HC162 Datasheet "Synchronous Presettable 4-Bit Counter," Aug. 2001, STMicroelectronics. pp. 1-12.*

* cited by examiner

*Primary Examiner* — Alexander Sofocleous
(74) *Attorney, Agent, or Firm* — Seed IP Law Group PLLC

(57) ABSTRACT

A secure memory includes a bistable memory cell having a programmed start-up state, and means for flipping the state of the cell in response to a flip signal. The memory may include a clock for generating the flip signal with a period, for example, smaller than the acquisition time of an emission microscope.

29 Claims, 2 Drawing Sheets

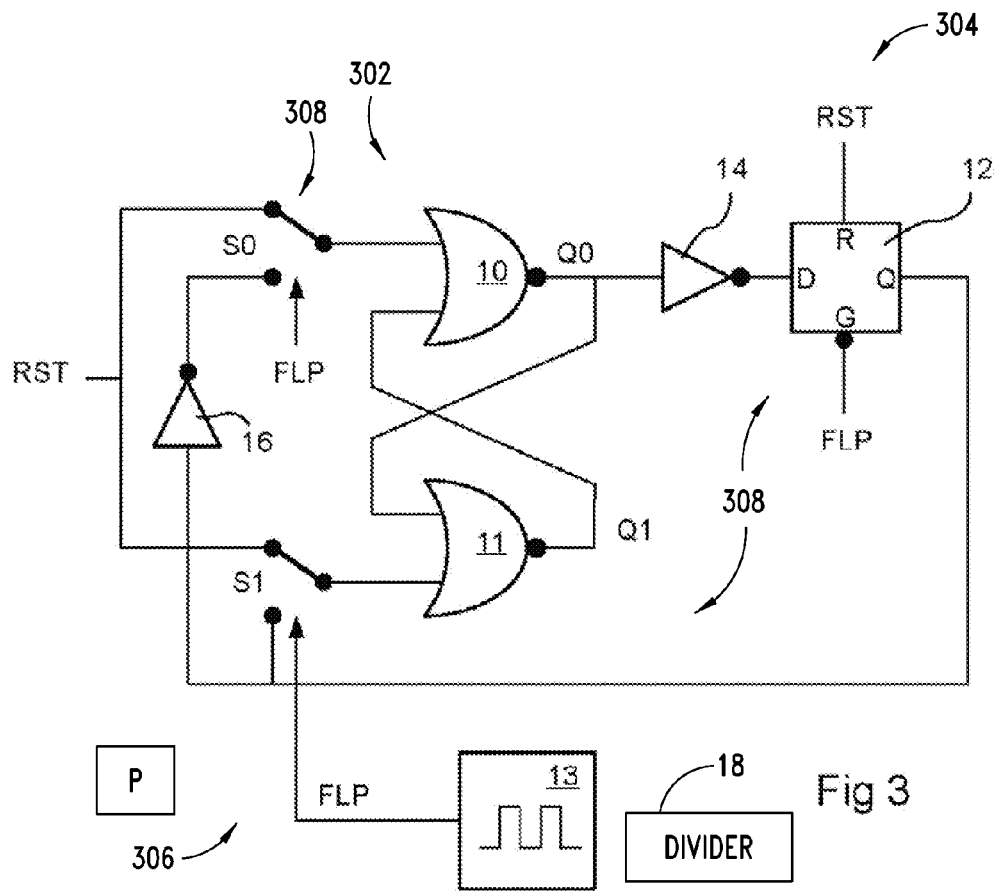
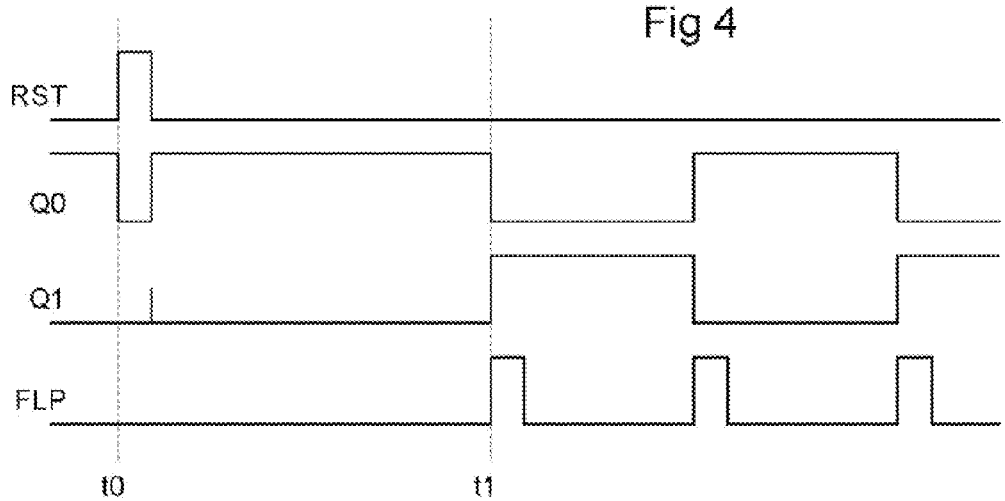

SECURE NON-VOLATILE MEMORY

BACKGROUND

1. Technical Field

This disclosure relates to non-volatile memory cells that may be programmed in the last fabrication stages of a circuit, and more specifically to a secure non-volatile memory, i.e., a memory whose content is difficult to reconstruct by analysis of the final circuit.

2. Description of the Related Art

Many circuits may embed firmware in a non-volatile memory. In most applications, the non-volatile memory is ROM. A drawback of a ROM is that its content is relatively easy to reconstruct by structural analysis of the circuit, which makes it less adapted to cryptography applications.

FIG. 1 schematically shows a non-volatile memory cell, such as disclosed in U.S. Pat. No. 7,697,319, whose content is rendered difficult to reconstruct by conventional analysis means. The basis of the cell is an RS-type bistable flip-flop comprised, for instance, of two NOR gates 10, 11. The output Q of each gate is connected to a first input of the other gate. The second inputs of gates 10, 11 receive a same reset signal RST, which is uncommon for an RS flip-flop, which should normally receive complementary states on these inputs for setting the state of the flip-flop.

During normal operation, signal RST is low, whereby gates 10, 11 behave as cross-coupled inverters. They provide complementary states a their outputs Q0, Q1. Hence, each gate confirms the state of the other gate. The state stored in the cell is taken from one of the outputs Q, say Q0.

When signal RST goes high, the outputs of gates 10, 11 are both forced to 0, which normally corresponds to a "prohibited" state. Indeed, when signal RST goes low again, the flip-flop is in a metastable state; gates 10, 11 both tend to go high—the first one to get there prevents the other from going high. When both gates are identical, it is not possible to foresee which one will go high. This uncertainty is encountered upon power-on of the circuit including the flip-flop.

The above mentioned patent provides making gates 10, 11 unbalanced in order to promote switching of the cell to a foreseeable state when it goes through a metastable state, upon power-on or after a reset.

FIG. 2 will be used to illustrate how that is done. It shows the structure of a NOR gate. The gate comprises two P-MOS transistors MP1, MP2, connected in series to a high power supply rail Vdd. Two N-MOS transistors MN1, MN2, are connected in parallel and connect transistors MP1, MP2 to a low power supply rail Vss.

The connection node between the sources of transistors MP2, MN1 and MN2 forms the output Q of the NOR gate. The gates of transistors MP1 and MN1 are connected together and form the first input A of the NOR gate. The second input B of the NOR gate is formed by the gates of transistors MP2 and MN2.

In order to unbalance the shown NOR gate with respect to the other NOR gate (not shown) of the flip-flop, without changing its physical structure, the threshold voltage of the N (or P) transistors of the gate is modified by changing the channel doping (or drain and source doping) by ion implant. When, for instance, the threshold voltage of the P transistors is thus increased, these transistors cease to conduct, thus cease to pull the output high, earlier than the P transistors of the other NOR gate. Therefore, the other NOR gate systematically "wins" in going high when the flip-flop is in a metastable state. A non-volatile "1" or "0" can thus be programmed in the cell by choosing one or the other NOR gate for the ion implant. Such programming may be achieved through a mask in the last fabrication steps of the circuit.

Such a memory cell has the same physical structure, whether it is programmed to 1 or to 0. It is thus generally not possible to find its programmed state through structural analysis means. Other analysis techniques however exist that may allow, in a circuit in operation, to detect the state stored in such a cell.

BRIEF SUMMARY

There is thus a need for a non-volatile memory cell whose programmed state is hard to detect in a circuit in operation.

This need may be satisfied by a secure memory comprising a bistable memory cell having a pre-programmed start-up state, and means for flipping the state of the cell in response to a flip signal.

The memory may comprise a clock for generating the flip signal with a period smaller than the acquisition time of an emission microscope.

According to an embodiment, the cell comprises two cross-coupled inverting elements, similar by the physical structure of their transistors, but dissimilar by the characteristics of the transistors.

According to an embodiment, the cell comprises a flip-flop connected to store the state of the cell in response to an active state of the flip signal; and a multiplexer connected to write the complement of the state of the flip-flop into the memory cell in response to the active state of the flip signal.

In an embodiment, a secure memory comprises a bistable memory cell having a pre-programmed start-up state, and means for flipping the state of the cell in response to a flip signal. In an embodiment, the memory comprises a clock for generating the flip signal with a period smaller than the acquisition time of an emission microscope. In an embodiment, the memory cell comprises two cross-coupled inverting elements, similar by the physical structure of their transistors, but dissimilar by the characteristics of the transistors. In an embodiment, the memory cell comprises a flip-flop connected to store the state of the cell in response to an active state of the flip signal, and a multiplexer connected to write the complement of the state of the flip-flop into the memory cell in response to the active state of the flip signal.

In an embodiment, a memory comprises a bistable memory cell having a programmed start-up state and logic configured to periodically flip a state of the memory cell. In an embodiment, the logic comprises a clock configured to generate a flip signal to trigger a flip of the state of the memory cell. In an embodiment, the clock has a period smaller than an acquisition time of an emission microscope. In an embodiment, the clock has a period of less than a second. In an embodiment, the clock has a period of less than 20 ns. In an embodiment, the logic is configured to commence periodically flipping of the state of the memory cell after a use threshold period of time has elapsed since a start-up of the memory. In an embodiment, the memory cell comprises first and second cross-coupled inverting elements having transistors with substantially similar physical dimensions, with at least one transistor of the first inverting element having an operating characteristic different from an operating characteristic of a corresponding transistor of the second inverting element. In an embodiment, the operating characteristic is a threshold voltage. In an embodiment, the memory cell comprises first and second cross-coupled inverting elements having transistors with substantially similar physical dimensions, with at least two transistors of the first inverting element having an operating characteristic different from an operating characteristic of corresponding transistors of the second inverting element. In an embodiment, the logic comprises: a flip-flop configured to store the state of the memory cell in response to an active state of a flip signal; and a multiplexer configured to write a complement of a state of the flip-flop into the memory cell in response to the active state of the flip signal. In an embodiment, the memory further comprises a divider configured to generate a signal indicative of a parity of the flip signal. In an embodiment, the memory cell is one of a plurality of bistable memory cells having programmed start-up states and the logic is configured to periodically flip states of each memory cell of the plurality of memory cells.

In an embodiment, a system comprises one or more processors and a memory. The memory has a plurality of bistable memory cells having programmed start-up states, and logic configured to periodically flip states of the plurality of bistable memory cells. In an embodiment, the logic comprises a clock configured to generate a flip signal to trigger flipping of the states of the bistable memory cells. In an embodiment, the logic is configured to commence periodically flipping of the states of the bistable memory cells after a use threshold period of time has elapsed since a start-up of the memory. In an embodiment, the bistable memory cells each comprise first and second cross-coupled inverting elements having transistors with substantially similar physical dimensions, with at least one transistor of the first inverting element having an operating characteristic different from an operating characteristic of a corresponding transistor of the second inverting element. In an embodiment, the logic comprises: a flip-flop configured to store a state of a bistable memory cell of the plurality in response to an active state of a flip signal; and a multiplexer configured to write a complement of a state of the flip-flop into the bistable memory cell in response to the active state of the flip signal. In an embodiment, the system comprises a divider configured to generate a signal indicative of a parity of the flip signal. In an embodiment, the memory is implemented in an integrated circuit.

In an embodiment, a method comprises: reading a state of a bistable memory cell of a memory; and after reading the state of the bistable memory cell, periodically flipping the state of the bistable memory cell. In an embodiment, the periodically flipping the state of the bistable memory cell comprises generating a clock signal. In an embodiment, the method comprises re-reading a state of the bistable memory cell. In an embodiment, the method comprises compensating for the periodically flipping of the state of the bistable memory cell. In an embodiment, the compensating comprises determining a parity of the clock signal. In an embodiment, the reading the state of the bistable memory cell of the memory comprises applying a reset signal to the bistable memory cell and reading an output of the bistable memory cell after the output of the bistable memory cell stabilizes at a programmed state; and the periodically flipping the state of the bistable memory cell comprising applying a periodic flip signal to the bistable memory cell instead of the reset signal.

In an embodiment, a system comprises: means for reading a state of a bistable memory cell; and means for periodically flipping the state of the bistable memory cell. In an embodiment, the system comprises means for programming the state of the bistable memory cell at a start-up of the system. In an embodiment, the system comprises means for compensating for periodic flipping of the state of the bistable memory cell.

In an embodiment, a non-transitory computer-readable medium contains contents to cause a computing device to perform a method, the method comprising: reading a state of a bistable memory cell; and after reading the state of the bistable memory cell, flipping the state of the bistable memory cell based on a periodic signal. In an embodiment, the method comprises re-reading a state of the bistable memory cell. In an embodiment, the method comprises compensating for the flipping of the state of the bistable memory cell.

BRIEF DESCRIPTION OF THE SEVERAL VIEWS OF THE DRAWINGS

Other advantages and features will become more clearly apparent from the following description of particular embodiments provided for exemplary purposes only and represented in the appended drawings, in which:

FIG. 3 shows an embodiment of a memory cell allowing the design of a secure memory whose programming state is hard to detect through a photon emission microscope; and FIG. 4 is a timing diagram of an exemplary operation of the cell of FIG. 3.

DETAILED DESCRIPTION

Figure 1:
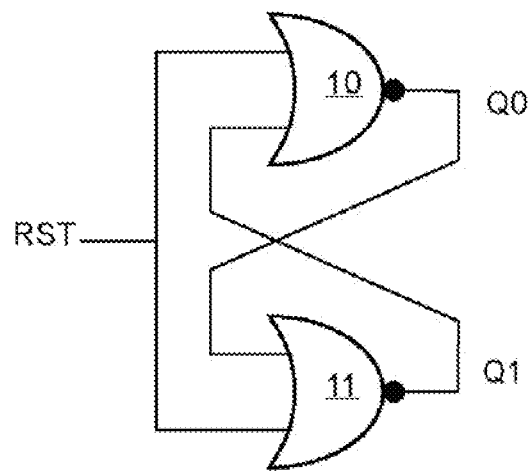
FIG. 1, previously described, shows an RS flip-flop configuration serving as a basis for a conventional secure memory cell.
Figure 2:
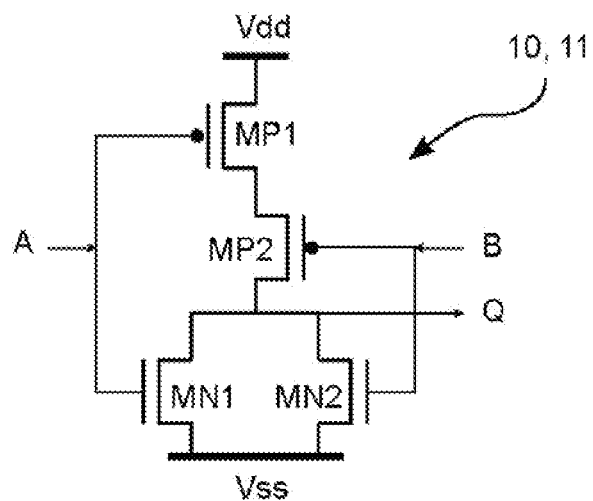
FIG. 2, previously described, shows a structure of a NOR gate used in the flip-flop of FIG. 1.

It has been found that the states stored in cells of the type of FIG. 1 could be retrieved through photon emission microscopy (PEM), from a circuit in operation.

An emission microscope, also known as EMMI, can detect photons generated by the channel currents of MOS transistors, from the backside of an integrated circuit. Since with recent technologies all transistors tend to leak, bias leak currents establish in the channels of the transistors of the NOR gate of FIG. 1. The leak currents of P-MOS and N-MOS transistors being distinct, independently of the ion implants, a gate at "1" (whose N-MOS transistors—in parallel—are off, but leak) has a distinct bias current than a gate at "0" (whose P-MOS transistors—in series—are off, but leak). This difference in bias currents being detectable by PEM, it is in theory possible to find the programmed states of the cells.

An EMMI, generally used for detecting permanent failures, is intended to measure a static state, because it needs a relatively long time interval to acquire a usable measure of the photons emitted by the circuit. The acquisition time increases with the need to discriminate smaller current differences.

In operation, cells of the type of FIG. 1, arranged as a memory, stay in a static state, i.e., they are not flipped unless they are reset, which happens infrequently. These conditions are ideal for PEM analysis.

In order to design a secure memory whose content is difficult to detect in operation by PEM, it is possible to exploit the slow acquisition time of an EMMI and the bistable nature of a cell of the type of FIG. 1.

More specifically, once the content of the memory has been used, which generally happens upon power-on or immediately after a reset, the state of each cell is regularly flipped, so that an EMMI does not have the necessary time to acquire a stable measure. Under these conditions, the EMMI will provide an average measure for each gate of the cell and, these gates spending substantially equal times at "1" and at "0", the averages for the two gates will be equal, or at least too close to be differentiated.

FIG. 3 schematically shows an exemplary embodiment of a memory cell 302 permitting this procedure. As illustrated, the memory cell is part of a memory 304 in a system 306, such as a set-top box, etc. The system 306 comprises one or more processors P. The memory cell 302 as illustrated is built around an RS flip-flop of the type of FIG. 1. The memory 304 may typically comprises a plurality of memory cells, including a plurality of memory cells configured to store a programmed value at a start-up of the memory.

The memory 304 includes logic 308 configured to flip a state of the memory cell 302. In operation, this structure saves the state of the cell in a D flip-flop 12 and writes its complement back into the cell in response to a flip signal FLP produced by a clock 13.

More specifically, the output Q0 of gate 10 is transmitted to the D-input of flip-flop 12 through an inverter 14. The control input G of flip-flop 12 receives the complement of signal FLP. Flip-flop 12 may, if necessary, be reset by a signal RST. The output Q of flip-flop 12 is connected to the first input of a multiplexer S0 through an inverter 16, and to the first input of a multiplexer S1. These multiplexers are shown as switches.

The outputs of multiplexers S0 and S1 are provided respectively to the inputs of gates 10, 11 that received the reset signal RST in FIG. 1. Signal RST is here provided to a second input of each of the multiplexers S0, S1. Multiplexers S0, S1 are controlled synchronously by flip signal FLP.

When signal FLP is inactive, corresponding to normal operation, multiplexers S0, S1 are set to provide signal RST to gates 10, 11, as shown.

FIG. 4 is a timing diagram illustrating the operation of the memory cell of FIG. 3. It shows an exemplary evolution of the outputs Q0, Q1 of gates 10, 11 as a function of the reset and flip signals RST, FLP.

Before a time t0, flip signal FLP is inactive: multiplexers S0, S1 connect signal RST to gates 10, 11. The control input G of flip-flop 12 is active, setting the flip-flop in its "transparent" state: flip-flop 12 copies its input D to its output Q. This has no influence on gates 10, 11, since multiplexers S0, S1 do not transmit to them the output of flip-flop 12. The outputs Q0, Q1 of gates 10, 11 are respectively at 1 and 0, corresponding to an example default programmed state.

At time t0, signal RST presents a pulse at 1. During this pulse, the output Q0 is forced from 1 to 0, while output Q1 stays at 0. When signal RST returns to 0, the outputs Q0 and Q1 both tend to reach 1. The unbalance between gates 10 and 11 in this example is such that output Q0 wins, forcing output Q1 back to 0.

A similar operation occurs upon powering-on of the cell, where all signal levels start at 0. If for any reason the cell does not stabilize at its programmed level, which may indeed happen when power-on is abrupt and generates parasitic pulses that manage to flip the cell, it is signal RST, systematically generated upon each power-on, that will fix the state of the cell.

At a time t1, after the content of the memory has been used, for instance copied into a volatile memory where it serves as program data or instructions, a first cell flip is caused by a pulse at 1 of signal FLP. State 1 of signal FLP locks flip-flop 12 that stores the last state, 1, of signal Q0 (as illustrated its complement through inverter 14).

Signal FLP moreover switches the multiplexers S0, 51 towards the output of flip-flop 12. Gate 10 thus receives a "1" and gate 11 a "0"—that causes gates 10 and 11 to flip to 0 and 1, respectively.

When signal FLP returns to 0, the cell returns to its normal configuration, and keeps its new state in a stable manner, despite the programmed unbalance between gates 10 and 11.

Pulses in signal FLP are then repeated regularly. At each pulse in signal FLP the outputs Q0, Q1 flip, as shown.

The period of the pulses in signal FLP is preferably smaller than the acquisition time of an EMMI, so that the EMMI cannot, at any time, provide a stable measure. The distance between times t1 and t0 is, preferably, also smaller than the acquisition time. The acquisition time of such a microscope is in the order of seconds, which leaves plenty of latitude for the use and then the "scrambling" of the stored data (the stored data may for example be used in less than 10 ns).

It is seldom necessary to read again the content of the non-volatile memory during operation of the circuit. If for some reason this is desirable, it is possible to take the parity of the pulses in signal FLP into account to determine whether the memory has its original content, or its logic complement. A divider 18 configured to divide the frequency of signal FLP by 2 will indicate the parity of the current pulse, at any time, by a 0 or a 1, and whether the data stored in the memory needs to be inverted or not upon reading.

As mentioned previously, the unbalance between gates 10 and 11, allowing the RS flip-flop to settle at a foreseen default state, may be obtained by modifying the doping levels of the P (or N) transistors of one of the gates by ion implant, which modifies the threshold voltages. In order to increase the unbalance, it may be devised to apply the same implant operation to all transistors of a same gate. Indeed, where an ion implant increases the threshold voltage of the P transistors, the same implant will decrease the threshold voltage of the N transistors, promoting the settling of the gate at state 0.

Many alternative techniques exist for causing an unbalance between the gates, for instance fabricating transistors of different sizes, connecting the bodies of the transistors to different voltage levels, etc. These alternative techniques, apart from the fact that they are harder to implement by mask programming, modify the physical structure of the transistors. As a result, the content of the memory programmed according to these techniques may be retrieved by a structural analysis. It is thus desirable to use techniques that modify the characteristics of the transistors without modifying their physical structure.

Many alternative embodiments of the principles described herein will appear to those skilled in the art. Although the specification is directed to a bistable cell in the form of a NOR-gate RS flip-flop, as an example, these principles apply to any type of bistable cell having a pre-programmed start-up state, for instance a SRAM-type cell including two similar cross-coupled inverters. Moreover, the logic levels of the various signals have been described in relation with particular examples—those skilled in the art may adapt the logic levels to the requirements of their particular structures and applications.

Some embodiments may take the form of or comprise computer program products. For example, according to one embodiment there is provided a computer readable medium comprising a computer program adapted to perform one or more of the methods or functions described above. The medium may be a non-transitory medium such as a physical storage medium, for example, a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, state machines, standard integrated circuits, controllers (e.g., programmed by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A memory comprising:
a bistable memory cell having a programmed start-up state; and
logic configured to periodically flip a state of the memory cell, the logic including:
a flip-flop configured to store the state of the memory cell in response to an active state of a flip signal; and
a multiplexer configured to write a complement of a state of the flip-flop into the memory cell in response to the active state of the flip signal.

2. The memory of claim 1 wherein the logic comprises a clock configured to generate the flip signal to trigger a flip of the state of the memory cell.

3. The memory of claim 2 wherein the clock has a period smaller than an acquisition time of an emission microscope.

4. The memory of claim 2 wherein the clock has a period of less than a second.

5. The memory of claim 2 wherein the clock has a period of less than 20 ns.

6. The memory of claim 2 further comprising a divider configured to generate a signal indicative of a parity of the flip signal.

7. The memory of claim 1 wherein the logic is configured to commence periodically flipping of the state of the memory cell after a use threshold period of time has elapsed since a start-up of the memory.

8. The memory of claim 1 wherein the memory cell comprises first and second cross-coupled inverting elements having transistors with substantially similar physical dimensions, with at least one transistor of the first inverting element having an operating characteristic different from an operating characteristic of a corresponding transistor of the second inverting element.

9. The memory of claim 8 wherein the operating characteristic is a threshold voltage.

10. The memory of claim 1 wherein the memory cell comprises first and second cross-coupled inverting elements having transistors with substantially similar physical dimensions, with at least two transistors of the first inverting element having an operating characteristic different from an operating characteristic of corresponding transistors of the second inverting element.

11. The memory of claim 1 wherein the memory cell is one of a plurality of bistable memory cells having programmed start-up states and the logic is configured to periodically flip states of each memory cell of the plurality of memory cells.

12. A system, comprising:
one or more processors; and
a memory having:
a plurality of bistable memory cells having programmed start-up states; and
logic configured to periodically flip states of the plurality of bistable memory cells, the logic including:
a flip-flop configured to store a state of a bistable memory cell of the plurality in response to an active state of a flip signal; and
a multiplexer configured to write a complement of a state of the flip-flop into the bistable memory cell in response to the active state of the flip signal.

13. The system of claim 12 wherein the logic comprises a clock configured to generate the flip signal to trigger flipping of the states of the bistable memory cells.

14. The system of claim 13 further comprising a divider configured to generate a signal indicative of a parity of the flip signal.

15. The system of claim 12 wherein the logic is configured to commence periodically flipping of the states of the bistable memory cells after a use threshold period of time has elapsed since a start-up of the memory.

16. The system of claim 12 wherein the bistable memory cells each comprise first and second cross-coupled inverting elements having transistors with substantially similar physical dimensions, with at least one transistor of the first inverting element having an operating characteristic different from an operating characteristic of a corresponding transistor of the second inverting element.

17. The system of claim 12 wherein the memory is implemented in an integrated circuit.

18. A method, comprising:
reading a bistable memory cell of a memory; and
after reading the bistable memory cell, periodically flipping a state of the bistable memory cell, the periodic flipping including:
storing the state of the bistable memory cell in a flip-flop in response to an active state of a flip signal; and
writing a complement of the state stored in the flip-flop into the bistable memory cell in response to the active state of the flip signal.

19. The method of claim 18 wherein the periodically flipping the state of the bistable memory cell comprises generating a clock signal.

20. The method of claim 19, comprising re-reading the bistable memory cell.

21. The method of claim 20, comprising compensating for the periodically flipping of the state of the bistable memory cell.

22. The method of claim 21 wherein the compensating comprises determining a parity of the clock signal.

23. The method of claim 18 wherein,
the reading the bistable memory cell of the memory comprises applying a reset signal to the bistable memory cell and reading an output of the bistable memory cell after the output of the bistable memory cell stabilizes at a programmed state; and
the periodically flipping the state of the bistable memory cell comprising applying the flip signal to the bistable memory cell instead of the reset signal.

24. A system, comprising:
means for reading a bistable memory cell;
means for storing a state of the bistable memory cell in response to an active state of a flip signal; and
means for writing a complement of the state stored in the means for storing into the bistable memory cell.

25. The system of claim 24, further comprising:
means for programming the state of the bistable memory cell at a start-up of the system.

26. The system of claim 24, further comprising:
means for compensating for periodic flipping of the state of the bistable memory cell.

27. A non-transitory computer-readable medium containing contents to cause a computing device to perform a method, the method comprising:
reading a state of a bistable memory cell; and
after reading the state of the bistable memory cell, flipping the state of the bistable memory cell based on a periodic signal, the periodic flipping including:
storing the state of the bistable memory cell in a flip-flop in response to an active state of the periodic signal; and
writing a complement of the state stored in the flip-flop into the bistable memory cell in response to the active state of the periodic signal.

28. The non-transitory computer-readable medium of claim 27 wherein the method comprises re-reading a state of the bistable memory cell.

29. The non-transitory computer-readable medium of claim 28 wherein the method comprises compensating for the flipping of the state of the bistable memory cell.

\* \* \* \* \*